United States Patent
Lee et al.

(10) Patent No.: US 8,587,191 B2
(45) Date of Patent: Nov. 19, 2013

(54) ORGANIC LIGHT EMITTING DEVICE AND COLOR DISPLAY APPARATUS USING THE SAME

(75) Inventors: Sung-hun Lee, Yongin-si (KR); Sang-yeol Kim, Yongin-si (KR); Mu-gyeom Kim, Yongin-si (KR); Jung-bae Song, Yongin-si (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 930 days.

(21) Appl. No.: 12/153,608

(22) Filed: May 21, 2008

(65) Prior Publication Data
US 2009/0102362 A1 Apr. 23, 2009

(30) Foreign Application Priority Data
Oct. 17, 2007 (KR) .......................... 10-2007-0104477

(51) Int. Cl.
*H01L 27/32* (2006.01)

(52) U.S. Cl.
USPC ............................................ 313/504; 257/40

(58) Field of Classification Search
USPC ........ 313/498–512; 428/690; 257/88–103, 40
See application file for complete search history.

(56) References Cited

U.S. PATENT DOCUMENTS

| | | | |
|---|---|---|---|
| 5,674,636 A | 10/1997 | Dodabalapur et al. | |
| 6,133,692 A | 10/2000 | Xu et al. | |
| 7,098,590 B2 * | 8/2006 | Lim et al. | 313/504 |
| 2005/0104511 A1 * | 5/2005 | Liao et al. | 313/504 |
| 2006/0102912 A1 * | 5/2006 | Abe et al. | 257/88 |
| 2006/0138945 A1 * | 6/2006 | Wolk et al. | 313/506 |
| 2006/0228897 A1 * | 10/2006 | Timans | 438/758 |
| 2007/0024168 A1 | 2/2007 | Nishimura et al. | |
| 2007/0291805 A1 * | 12/2007 | Ledentsov et al. | 372/38.01 |
| 2008/0268282 A1 * | 10/2008 | Spindler et al. | 428/690 |

FOREIGN PATENT DOCUMENTS

| | | |
|---|---|---|
| EP | 1244153 A2 | 12/2001 |
| EP | 1401034 A2 | 9/2003 |
| EP | 1478025 A2 | 5/2004 |

OTHER PUBLICATIONS

Appl. Phys. Lett. 87, 253501 (2005); Highly efficient white organic electroluminescent devices based on tandem architecture Chan-Ching Chang, Jenn-Fang Chen, Shiao-Wen Hwang2, and Chin H. Chen.*

(Continued)

*Primary Examiner* — Anne Hines
*Assistant Examiner* — Jacob R Stern
(74) *Attorney, Agent, or Firm* — Robert E. Bushnell, Esq.

(57) ABSTRACT

A top-emitting or bottom-emitting OLED has a wide color gamut and reduces a variation in color with a viewing angle. The OLED includes a reflective electrode and a transmissive or semi-transmissive electrode disposed opposite each other; at least two organic emission layers (EMLs) interposed between the reflective electrode and the transmissive or semi-transmissive electrode; and an optical path control layer disposed on an outer surface of the transmissive or semi-transmissive electrode. A resonator is formed between the reflective electrode and the optical path control layer so a resonance mode of light extracted from the optical path control layer is a multi-resonance mode having at least two modes in a visible light region. A distance between the organic EMLs satisfies the condition of constructive interference between light beams emitted by the respective organic EMLs. A color display apparatus using the OLED are taught.

21 Claims, 17 Drawing Sheets

(56) References Cited

OTHER PUBLICATIONS

Constructive and Destructive Interference at http://www.windows2universe.org/earth/Atmosphere/tornado/beat.html, Apr. 15, 2011.

Interference (wave propagation)—Wikipedia at http://en.wikipedia.org/wiki/Interference_(wave_propagation), Oct. 31, 1994.

Dodabalapur, A et al.: "Color Variation with Electroluminescent Organic Semiconductors in Multimode Resonant Cavities." Applied Physics Letters, AIP, American Institute of Physics, Melville NY, US, vol. 65, No. 18, Oct. 31, 1994, pp. 2308-2310, XPOOO476525, ISSN: 0003-6951, DOI: DOI:10.1063/1.112726, which was cited in the European Search Report issued by EPO, dated Apr. 27, 2011, corresponding to European Patent Application No. 08158039.1-1235/2051312.

European Search Report issued by EPO on Apr. 27, 2011 in Applicant's corresponding European Patent Application No. 08158039.1.

* cited by examiner

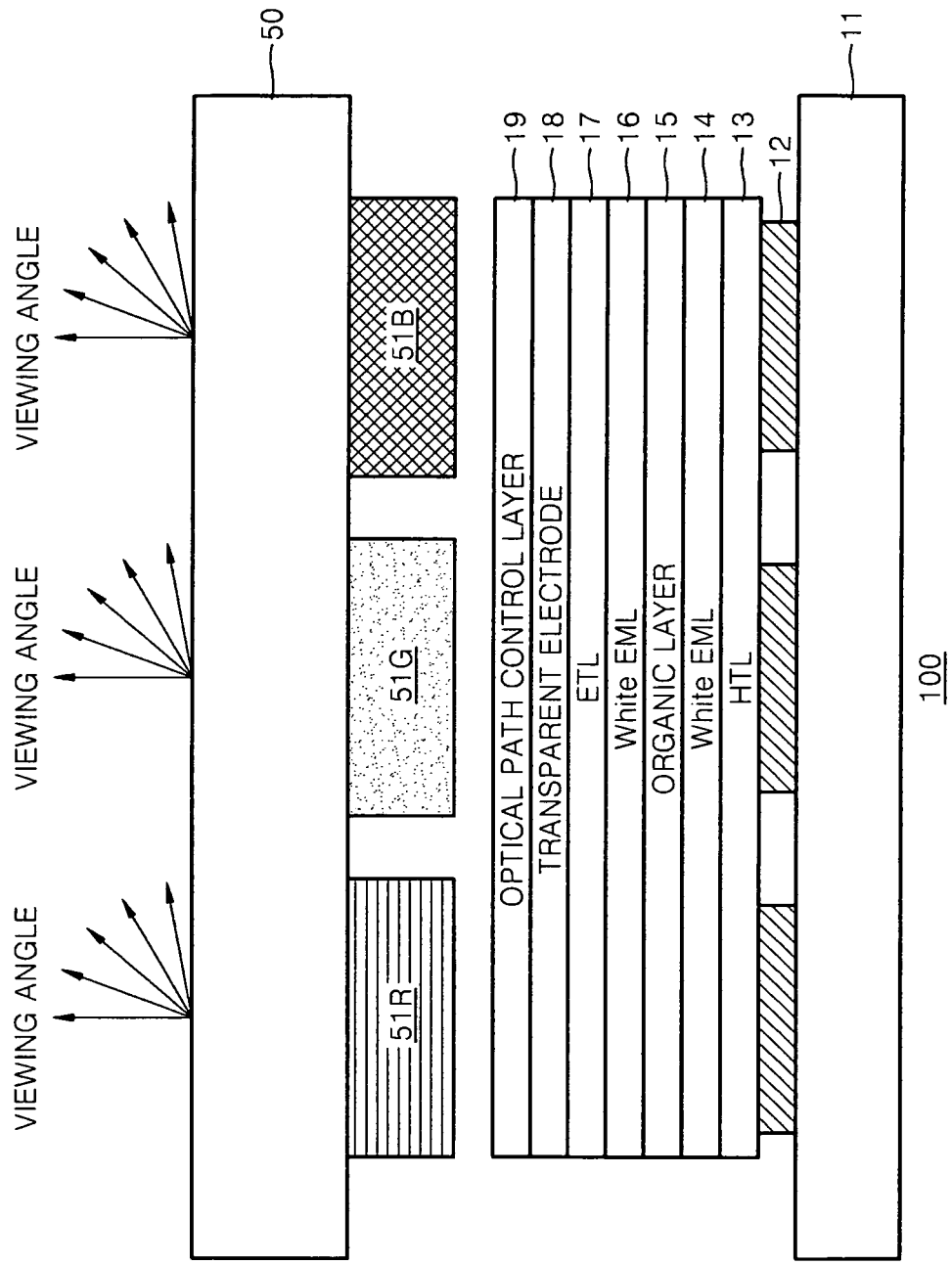

ORGANIC LIGHT EMITTING DEVICE AND COLOR DISPLAY APPARATUS USING THE SAME

CLAIM OF PRIORITY

This application makes reference to, incorporates the same herein, and claims all benefits accruing under 35 U.S.C. §119 from an application for ORGANIC LIGHT EMITTING DEVICE AND COLOR DISPLAY APPARATUS USING THE SAME earlier filed in the Korean Intellectual Property Office on 17 Oct. 2007 and there duly assigned Serial No. 10-2007-0104477.

BACKGROUND OF THE INVENTION

1. Field of the Invention

The present invention relates to an organic light emitting device (OLED) and a color display apparatus using the same, and more particularly, to a top-emitting or bottom-emitting OLED, which improves a color gamut and reduces a variation of color with a viewing angle, and a color display apparatus employing such improved OLED.

2. Description of the Related Art

In an organic light emitting device (OLED), holes from an anode combine with electrons from a cathode in an organic emission layer (EML) formed between the anode and the cathode to emit light, thereby forming an image. Since the OLED has excellent display characteristics, such as a wide viewing angle, a faster response speed, a smaller thickness, a lower fabrication cost, and a higher contrast, the OLED has attracted much attention as an advanced flat panel display device.

In general, the OLED may have a multilayered structure in order to improve luminous efficiency. For example, a hole injection layer (HIL) and a hole transport layer (HTL) may be further formed between an anode and an organic EML, and an electron injection layer (EIL) and an electron transport layer (ETL) may be further formed between a cathode and the organic EML. Also, other additional layers may be further formed.

The OLED may emit light in a desired color by forming the organic EML using an appropriate material. Based on this principle, it is possible to embody a color display apparatus using the OLED. For example, in a color display apparatus using an OLED, each of pixels may include a sub-pixel having a red (R) organic EML, a sub-pixel having a green (G) organic EML, and a sub-pixel having a blue (B) organic EML. When different organic EMLs are formed in respective sub-pixels, however, it is difficult to embody large-area high-resolution display apparatuses due to a complicated fabrication process.

In order to overcome the drawback, a white OLED has been proposed. The white OLED may be embodied by forming a plurality of organic emission materials for emitting light in R, G, and B colors in an organic EML or forming two or more pairs of organic emission materials for emitting light in complementary colors. The white OLED creates colors using color filters. In this case, since all sub-pixels include organic EMLs with the same structure, fabricating large-area high-resolution display apparatuses is relatively easy.

Meanwhile, OLEDs may be classified into bottom-emission OLEDs and top-emission OLEDs depending on a direction in which light is emitted from an organic EML. In a bottom-emission OLED, light is extracted to a bottom surface of the OLED on which a thin film transistor (TFT) for driving the OLED is disposed. In a top-emission OLED, a reflective electrode is disposed under an organic EML so that light is extracted to an upper portion of a TFT. Typically, since the top-emission OLED may increase an emission area (or aperture ratio) more than the bottom-emission OLED, the top-emission OLED is more suited for high-resolution OLEDs.

In the top-emission OLED, however, resonant cavities are formed between a reflective electrode disposed under an organic EML and a semi-transmissive electrode disposed on the organic EML. Since resonance caused in the resonant cavities narrows the spectrum of externally emitted light, it is advantageous at extracting only light with a specific wavelength, but it is disadvantageous at extracting white light. Also, a top-emission white OLED using color filters narrows a color gamut and increases a variation of color with a viewing angle.

In order to solve this problem, an OLED for extracting only light with a specific wavelength using a single resonator mode has been proposed. In this case, however, the optical thickness of resonant cavities should be varied according to the wavelength of light. Therefore, fabrication of a color display apparatus using the OLED may involve a very complicated process so that the optical thickness of the resonant cavities may be controlled to be different according to respective R, G, and B sub-pixels.

SUMMARY OF THE INVENTION

It is therefore one object of the present invention to provide an improved top-emission or bottom-emission organic light emitting display (OLED) device that is free of the disadvantages above.

It is another object for the present invention to provide a top-emission or bottom-emission organic light emitting display (OLED) device using color filters, in which has a wide color gamut and reduces a variation of color with a viewing angle.

It is still another object for the present invention to provide a color display apparatus using the above-described OLED.

According to an aspect of the present invention, there is provided an OLED including a reflective electrode and a transmissive or semi-transmissive electrode disposed opposite each other; at least two organic emission layers (EMLs) interposed between the reflective electrode and the transmissive or semi-transmissive electrode; and an optical path control layer prepared on an outer surface of the transmissive or semi-transmissive electrode. In the OLED, a resonator is formed between the reflective electrode and the optical path control layer so that a resonance mode of light extracted from the optical path control layer is a multi-resonance mode having at least two modes in a visible light region. A distance between the organic EMLs satisfies the condition of constructive interference between light beams emitted by the respective organic EMLs.

The at least two organic EMLs may be white EMLs, each of which includes a red (R) EML, a green (G) EML, and a blue (B) EML.

The at least two organic EMLs may be white EMLs, each of which includes two kinds of single-color or multi-color EMLs that emit light in complementary colors.

Each of distances between the EMLs of the at least two organic EMLs that emit light in the same color may satisfy the condition of the constructive interference.

A distance between the EMLs of at least two organic EMLs that emit light in the same color may be greater than a distance that permits center wavelength of a blue color to satisfy the condition of the constructive interference.

A distance between the EMLs of at least two organic EMLs that emit light in the same color may be within ±10% of a distance that permits center wavelength of the blue color to satisfy the condition of the constructive interference.

The at least two organic EMLs may be single-color EMLs that emit light in the same color.

The OLED may further include a PN junction layer interposed between the at least two organic EMLs.

The PN junction layer may include an n-doped electron transport layer (ETL) and a p-doped hole transport layer (HTL).

The optical path control layer may be formed of a material having an optical transmittance of 90% or higher in the visible light region.

The optical path control layer may have a refractive index of about 1.6 to 2.6.

The optical path control layer may be formed of at least one selected from the group consisting of $Al_2O_3$, BaO, MgO, $HfO_2$, $ZrO_2$, $CaO_2$, $SrO_2$, $Y_2O_3$, $Si_3N_4$, AlN, GaN, ZnS, and CdS.

The optical path control layer may have a thickness of about 300 nm to 900 nm.

The reflectance of the transmissive or semi-transmissive electrode may range from 0.1 to 50%.

The transmissive or semi-transmissive electrode may be formed using one of a thin metal layer and a transparent conductive oxide.

The OLED may further include a multiple dielectric mirror layer disposed on a top surface of the optical path control layer. The multiple dielectric mirror layer may be formed alternating a high-refractive index dielectric layer and a low-refractive index dielectric layer.

The OLED may further include a thin metal mirror layer disposed on a top surface of the optical path control layer.

According to another aspect of the present invention, there is provided a color display apparatus including a reflective electrode and a transmissive or semi-transmissive electrode disposed opposite each other; at least two organic EMLs interposed between the reflective electrode and the transmissive or semi-transmissive electrode; an optical path control layer disposed on an outer surface of the transmissive or semi-transmissive electrode; a transparent substrate disposed opposite the optical path control layer; and a plurality of color filters disposed on a surface of the transparent substrate. Resonators are respectively formed between the reflective electrodes and the optical path control layer so that a resonance mode of light extracted from the optical path control layer is a multi-resonance mode having at least two modes in a visible light region. Also, a distance between the organic EMLs satisfies the condition for constructive interference between light beams emitted by the respective organic EMLs, and the condition of constructive interference satisfying an equation as follows:

$$2\pi \cdot q = \sum_j \left( \frac{2\pi 2 n_{j\lambda} d_j}{\lambda} + \delta_j \right),$$

where $n_{j\lambda}$ denotes a reflective index of a j-th layer of the white OLED with respect to a predetermined light wavelength $\lambda$, $d_j$ denotes a thickness of the j-th layer of the white OLED, $\delta_j$ denotes a phase change caused when light passes through the j-th layer and when the light is reflected by the optical path control layer, the transmissive or semi-transmissive electrode, and the reflective electrode, and q denotes an arbitrary integral number.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein:

FIG. 13 is a cross-sectional view of a color display apparatus using the white OLED of FIG. 1, constructed as an embodiment of the present invention.

DETAILED DESCRIPTION OF THE INVENTION

Figure 1:
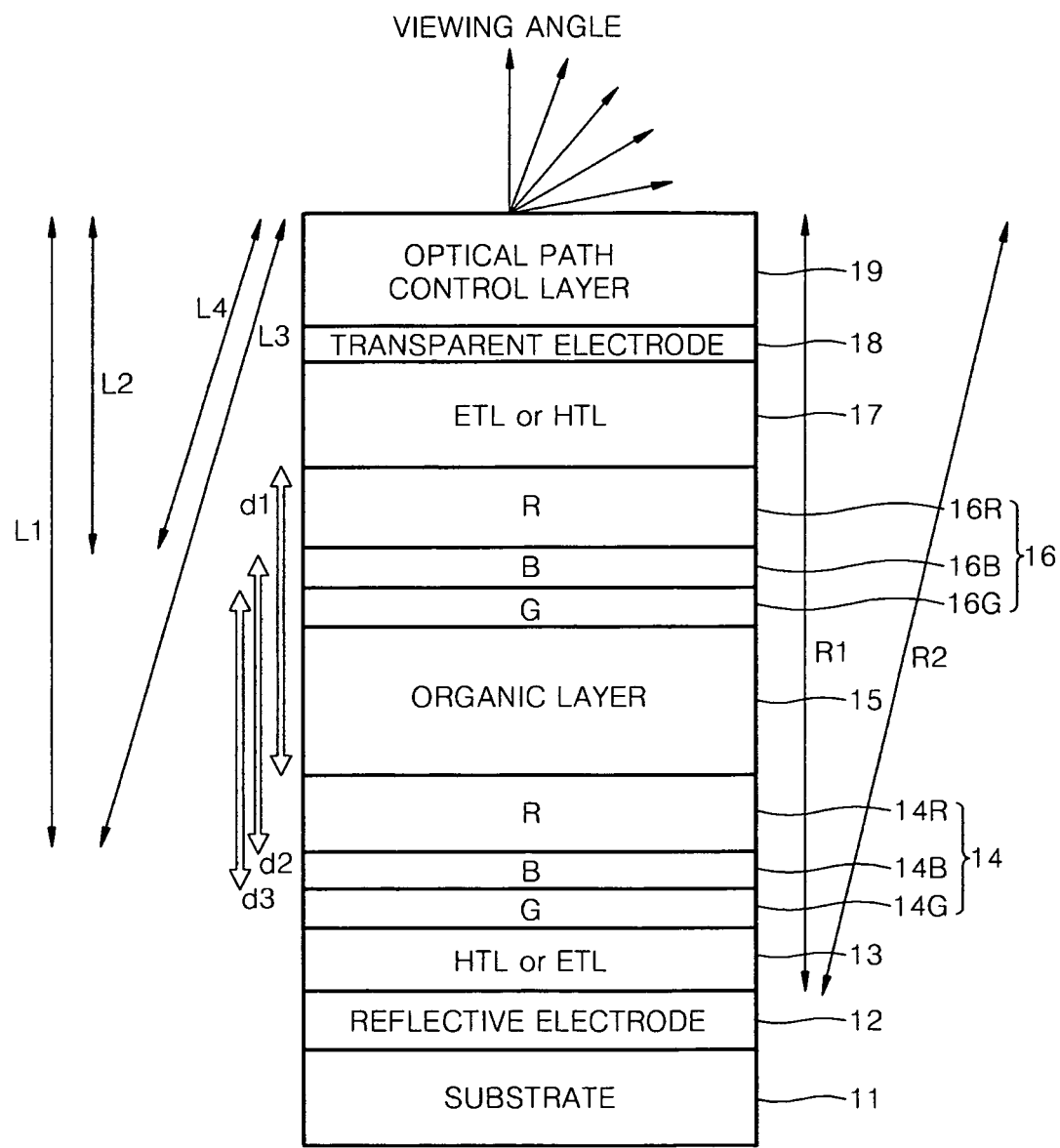
FIG. 1 is a schematic view of a top-emitting white organic light emitting display (OLED) device constructed as an embodiment of the present invention.

The present invention will be described more fully hereinafter with reference to the accompanying drawings, in which exemplary embodiments of the invention are shown. The same reference numerals are used to denote the same elements throughout the specification. In the drawings, the thicknesses of layers and regions are exaggerated for clarity. Although a top-emitting organic light emitting display (OLED) device is exemplarily illustrated in the drawings, the present invention is not limited to the top-emitting OLED device and can be also applied to a bottom-emitting OLED device.

FIG. 1 is a schematic view of a top-emitting white OLED 10 constructed as an embodiment of the present invention.

Referring to FIG. 1, top-emitting white OLED 10 includes a substrate 11, a reflective electrode 12, a transmissive electrode 18, at least two organic emission layers (EMLs) 14 and 16 disposed between reflective electrode 12 and transmissive electrode 18, layers 13, 15, and 17 for emitting electrons and holes to organic EMLs 14 and 16, and an optical path control layer 19 disposed on an outer surface of transmissive electrode 18. Substrate 11 may be, for example, a glass substrate. A thin film transistor (TFT) (not shown) may be prepared on substrate 11 in order to control the operation of OLED 10. Transmissive electrode 18 may be formed of a transparent conductive oxide (TCO), such as indium tin oxide (ITO) or indium zinc oxide (IZO). Transmissive electrode 18, however, may be replaced by a semi-transmissive electrode obtained by coating a thin metal layer.

Reflective electrode 12 may be an anode and transmissive electrode 18 may be a cathode. Alternatively, reflective electrode 12 may be a cathode and transmissive electrode 18 may be an anode. When reflective electrode 12 is an anode and transmissive electrode 18 is a cathode, layer 13 interposed between reflective electrode 12 and first EML 14 may be a hole transport layer (HTL), and layer 17 interposed between transmissive electrode 18 and second EML 16 may be an electron transport layer (ETL). Conversely, layer 13 interposed between reflective electrode 12 and first EML 14 may be an ETL, and layer 17 interposed between transmissive electrode 18 and second EML 16 may be an HTL. Also, an organic layer 15 may be further disposed between first and second EMLs 14 and 16 to control a distance between first and second EMLs 14 and 16.

Furthermore, first and second EMLs 14 and 16 may have various structures to create white light. For example, as shown in FIG. 1, first EML 14 may include a red (R) EML 14R, a blue (B) EML 14B, and a green (G) EML 14G, and second EML 16 may include an R EML 16R, a B EML 16B, and a G EML 16G. Each of first and second EMLs 14 and 16, however, may be formed of two or more emission materials that emit light in complementary colors.

In general, an optical mode of light extracted from the OLED should be a multi-mode by generating multi-resonance in the OLED so that the white OLED can create high-quality white light and have a wide color gamut. Also, the variation of an optical mode due to a difference in an optical path relative to a viewing angle should be minimized so that the white OLED can have a wide color gamut and reduce a variation of color in a wide viewing angle.

According to the present invention, in order to cause multi-resonance in OLED 10 shown in FIG. 1, a layer interposed between transmissive electrode 18 and reflective electrode 12 is maintained at an constant thickness and optical path control layer 19 is disposed on transmissive electrode 18 so that a resonator is designed to an optimal optical thickness. The present inventor has found that when optical path control layer 19 is formed in white OLED 10 having the above-described structure, it is possible to improve the quality of white light by appropriately selecting resonance conditions. In general, the wavelength of a resonator in a resonator mode (i.e., a resonance wavelength) depends on the optical thickness of the resonator. Also, when the resonator has a great optical thickness, a plurality of resonator modes are present in the visible light (VL) wavelength region of about 400 nm to 700 nm. Accordingly, multi-mode resonance may be designed by appropriately controlling the optical thickness of optical path control layer 19 in white OLED 10.

According to the Febry-Perot interference condition, the condition for a resonating mode to exist in white OLED 10, in which layer 13 and transmissive electrode 18 between optical path control layer 19 and reflective electrode 12 are formed of a plurality of layers, is as the following Equation (1):

$$2\pi \cdot q = \sum_j \left( \frac{2\pi 2 n_{j\lambda} d_j}{\lambda} + \delta_j \right), \quad (1)$$

wherein $n_{j\lambda}$ denotes the reflective index of a j-th layer of white OLED 10 with respect to a wavelength $\lambda$, $d_j$ denotes the thickness of the j-th layer, $\delta_j$ denotes a phase change caused when light passes through the j-th layer and when light is reflected by optical path control layer 19, transmissive electrode 18, and reflective electrode 12. Also, q denotes an arbitrary integral number. Here, it can be seen that when the optical thickness of a resonator becomes excessively great, multiple solutions for satisfying different values of q are obtained in different wavelengths.

In order to satisfy the above-described condition, optical path control layer 19 may be formed to a sufficiently great thickness so as to enable effective multiple-resonance, although FIG. 1 illustrates optical path control layer 19 with a small thickness for brevity. Actually, the thickness of optical path control layer 19 may be greater than the sum of the thicknesses of the layers interposed between transmissive electrode 18 and reflective electrode 12. For instance, optical path control layer 19 may be formed to a minimum thickness of about 300 nm to 400 nm and a maximum thickness of about 700 nm to 900 nm.

In order to reduce a reflection effect at an interface between transmissive electrode 18 and optical path control layer 19, optical path control layer 19 may have about the same refractive index as transmissive electrode 18 and organic layers interposed between transmissive electrode 18 and reflective electrode 12. For example, optical path control layer 19 may have a refractive index of approximate 1.6 to 2.6 in a visible light (VL) region. Furthermore, optical path control layer 19 may be formed of a material with a high optical transmittance in order to minimize optical loss in optical path control layer 19. For instance, the optical transmittance of optical path control layer 19 may be about 90% or higher in the VL region. Optical path control layer 19 may be formed of, for example, at least one selected from the group consisting of $Al_2O_3$, BaO, MgO, $HfO_2$, $ZrO_2$, $CaO_2$, $SrO_2$, $Y_2O_3$, $Si_3N_4$, AlN, GaN, ZnS, and CdS.

Although not shown in the drawings, a low-refractive index layer formed of gas or a filler with a low refractive index may be disposed on optical path control layer 19. The low-refractive index layer may be formed of a material having a refractive index less than 1.4 to facilitate reflection of light by the top surface of optical path control layer 19. The low-refractive index layer may be not an additional physical layer stacked on optical path control layer 19 but an air or gas layer disposed outside optical path control layer 19. In particular, when OLED 10 constructed as the present invention is encapsulated in a pixel of a display apparatus, the low-refractive index layer may be a material layer filled in the pixel. As a result, it can be inferred that any other material layer with a high refractive index may be not formed on optical path control layer 19 instead of forming the low-refractive index layer to facilitate reflection of light by the top surface of optical path control layer 19. For example, when OLED 10 is encapsulated, an encapsulant, such as glass, is not in contact with optical path control layer 19 and the low-refractive index layer is interposed between the encapsulant and optical path control layer 19.

Although not shown in the drawings, when an additional layer (e.g., a color filter) having a refractive index of 1.4 or more is brought into contact with optical path control layer 19, a multiple dielectric mirror or a thin metal mirror may be further formed on the top surface of optical path control layer 19 in order to increase the reflectance of optical path control layer 19. In this case, the multiple dielectric mirror may be formed by alternating a high-refractive index dielectric layer and a low-refractive index dielectric layer.

In the above-described structure, a resonator may be formed between reflective electrode 12 and optical path control layer 19. Also, when transmissive electrode 18 has a predetermined reflectance, additional resonators may be formed between reflective electrode 12 and transmissive electrode 18 and between optical path control layer 19 and transmissive electrode 18. If the reflectance of transmissive electrode 18 becomes high, resonance occurs only between reflective electrode 12 and transmissive electrode 18. As a result, when the reflectance of transmissive electrode 18 becomes excessively high, the effect of multi-resonance is reduced. Therefore, according to the present invention, the reflectance of transmissive electrode 18 ranging from about 0.1% to 50% is suited, and the reflectance of transmissive electrode 18 ranging from about 0.1% to 30% is best suited. The reflectance of transmissive electrode 18 is minimized to allow principal resonance to occur between reflective electrode 12 and optical path control layer 19.

As described above, a variation in an optical mode due to a difference in an optical path caused by varying a viewing angle should be minimized so that OLED device 10 can have a wide color gamut and reduce a variation of color in a wide viewing angle. According to the present invention, in order to reduce the variation in the optical mode due to the difference in the optical path, a distance (L1-L2) between first and second EMLs 14 and 16 is determined to satisfy constructive interference. In constructive interference, two waves having a phase difference between 0 to $\pi/2$ interference with each other, and the resulted wave has an amplitude larger than any of those two initial wave. When the phase difference equals to 0, the resulted wave obtains the maximum amplitude which equals to the sum of the amplitudes of those two initial waves. In particular, a distance between a pair of single-color EMLs of first and second EMLs 14 and 16 that emit light in the same color may be also determined to satisfy constructive interference. For example, each of a distance d1 between first R EML 14R and second R EML 16R, a distance d2 between first B EML 14B and second B EML 16B, and a distance d3 between first G EML 14G and second G EML 16G is determined to allow constructive interference. The following Table 1 shows distances between the pairs of R, B, and B EMLs that satisfy constructive interference.

TABLE 1

| | Emission color | | |
|---|---|---|---|
| | Blue | Green | Red |
| Center wavelength of colors (nm) | 460 nm | 520 nm | 610 nm |
| Condition of constructive interference (Cycle (T)) | 121 nm | 141 nm | 169 nm |

As shown in Table 1, a distance between a pair of single-color EMLs that emit light in the same color may vary with color within a small range. For example, a distance d1 between first R EML 14R and second R EML 16R may be approximately 169 nm, distance d2 between first B EML 14B and second B EML 16B may be approximately 121 nm, and distance d3 between first G EML 14G and second G EML 16G may be approximately 141 nm. Distances d1, d2, and d3 may be adjusted by controlling the thickness of organic layer 15 between first and second EMLs 14 and 16 and the thicknesses of the respective single-color EMLs 14R, 14G, 14B, 16R, 16G, and 16B. Distances d1, d2, and d3 however may be practically designed to be the same in consideration of process simplicity. In this case, a distance between a pair of single-color EMLs of first and second EMLs 14 and 16 that emit light in the same color may be greater than at least a distance that permits center wavelength of a blue color to satisfy the condition of constructive interference. Even so, the distance between the pair of single-color EMLs of first and second EMLs 14 and 16 that emit light in the same color may have a tolerance of approximately ±10%. Accordingly, the distance between the pair of single-color EMLs of first and second EMLs 14 and 16 that emit light in the same color may be within ±10% of the distance that permits center wavelength of the blue color to satisfy the condition of constructive interference.

Referring to FIG. 1, it may be seen that light traveling vertically to white OLED 10 is emitted by a first resonator R1, while light traveling at a predetermined angle to white OLED 10 is emitted by a second resonator R2. Conventionally, the length of an optical path varies according to a viewing angle so that different resonator modes are enabled to cause a variation of color. According to the present invention, however, light emitted by first EML 14 constructively interferes with light emitted by second EML 16 so that a color variation due to first EML 14 counteracts a color variation due to second EML 16. Here, the distance between first and second EMLs 14 and 16 with respect to inclined light is changed into a distance (L3-L4), but such a variation in the distance is still allowable for the condition of constructive interference. A distance between first and second EMLs 14 and 16 may be selected so as to cause constructive interference between light beams emitted by at least two EMLs, thereby greatly reducing a color variation affected by a variation in the viewing angle.

In order to confirm the advantages of the present invention, a computer simulation was conducted on two OLEDs having different constructions. A first OLED is an OLED according to an embodiment of the present invention in which a distance between two white EMLs satisfies the condition of constructive interference. A second OLED is an OLED according to a comparative example, which includes only a single white EML.

First Computer Simulation: Comparative Example

Figure 2:
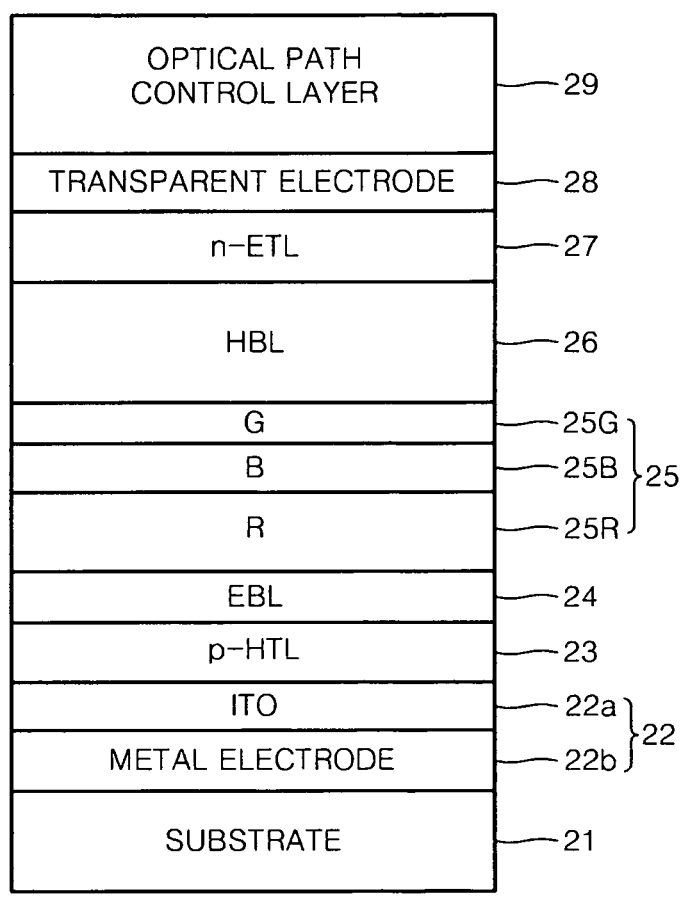
FIG. 2 is a schematic view of a white OLED according to a comparative example.

The first computer simulation was conducted on the comparative example shown in FIG. 2. Referring to FIG. 2, a white OLED 20 according to the comparative example includes a substrate 21 and a reflective electrode 22, a p-doped HTL 23, an electron blocking layer (EBL) 24, a white EML 25, a hole blocking layer (HBL) 26, an n-doped ETL 27, a transmissive electrode 28, and an optical path control layer 29, which are stacked sequentially on substrate 21. Reflective electrode 22 may be an anode, which includes a transparent electrode 28, which is formed of indium tin oxide (ITO) 22a having a large work function to emit holes, and a metal electrode 22b functioning as a reflective layer. Transmissive electrode 28 may be a cathode, which is formed using an ITO layer or a thin metal layer. White EML 25 may include an R EML 25R, a B EML 25B, and a G EML 25G.

The first computer simulation was conducted on the comparative example shown in FIG. 2 in which an optical thickness between metal electrode 22b and transmissive electrode 28 was controlled to be 200 nm, the wavelength of a resonator mode (or a resonance wavelength) was controlled to be 314 nm in consideration of a phase change, and the thickness of optical path control layer 29 was controlled to be 490 nm. In this case, it is assumed that optical path control layer 29 has a refractive index of 2 and an absorption coefficient of 0. Also, it is assumed that white light having the same intensity of 1 is emitted by R EML 25R, B EML 25B, and G EML 25G of white EML 25 shown in FIG. 2.

Figure 4:
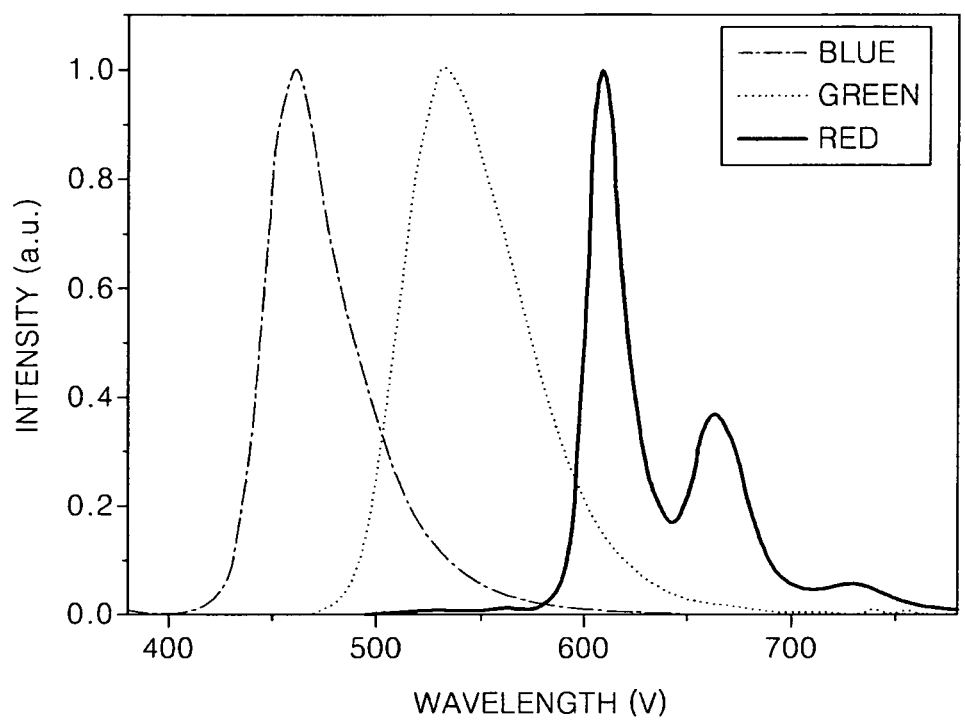
FIG. 4 is a two dimensional graph showing red(R)/blue(B)/green(G) spectra used for a simulation according to the present invention.

By multiplying a transmissive spectrum of OLED 20 by internal emission spectra of R, B, and B light beams shown in FIG. 4 in a ratio of 2.3:0.6:2, an external emission spectrum of OLED 20 can be obtained. Since the graph of FIG. 4 is based on normalized values, the ratio is multiplied with internal emission spectra shown in FIG. 4 to obtain the actual characteristics of an actually manufactured EMC. As a result, a white spectrum having chromaticity coordinates (0.298, 0.341) may be obtained from the front view.

Figure 5:
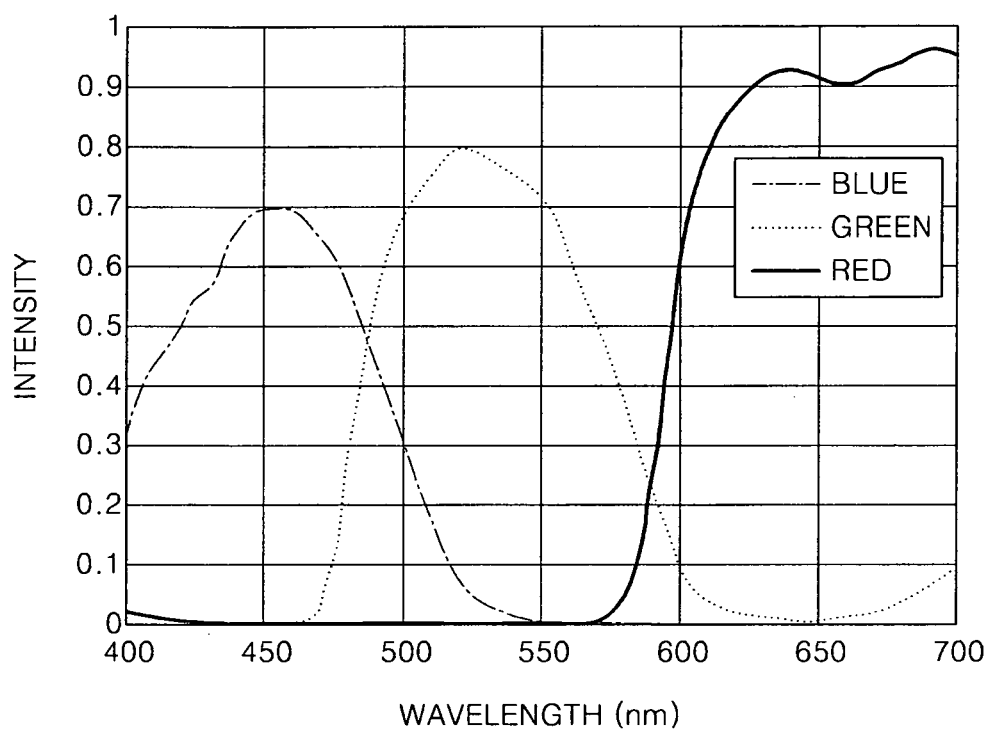
FIG. 5 is a two dimensional graph showing transmissive spectra of color filers used for a simulation according to the present invention.
Figure 6:
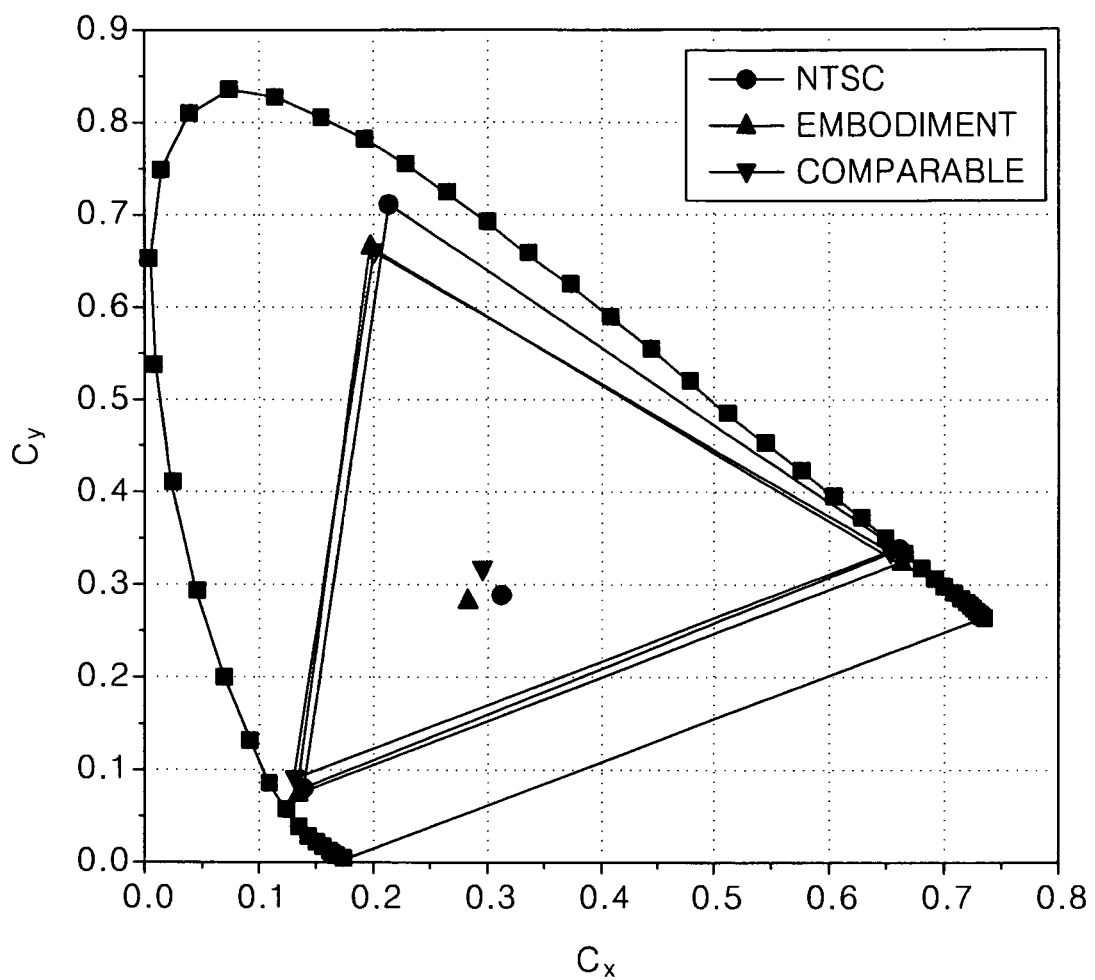
FIG. 6 is a chromaticity diagram showing a color reproduction range, which is measured by comparing chromaticity coordinates calculated using the spectra of FIG. 4 and the transmittances of color filters of FIG. 5 with National Television Standards Committee (NTSC) chromaticity coordinates.

The multiplication of the resultant external emission spectrum by transmissive spectra of color filters of FIG. 5 results in the chromaticity coordinates of R, G, and B emitted by R, G, and B color filters, which transmit white light, and the chromaticity coordinates of white light obtained by mixing the R, G, and B light as shown in Table 2. Table 2 shows the result coordinate values of colors in CIE 1931 x, y chromaticity diagram. As can be seen from Table 2, after white light is transmitted through the color filters, the white spectrum having chromaticity coordinates (0.295, 0.355) can be obtained from the front view. FIG. 6 is a graph of a comparison of the above-described chromaticity coordinates according to the first computer simulation with national television system committee (NTSC) chromaticity coordinates. In FIG. 6, '-●-' denotes the NTSC chromaticity coordinates, and '-▼-' denotes the chromaticity coordinates according to the first computer simulation. According to the first computer simulation, a color reproduction range of about 89% may be obtained from the front view.

TABLE 2

|  |  | x | y |
|---|---|---|---|
| Original | W | 0.298 | 0.341 |
| Color filters | W | 0.295 | 0.355 |
|  | R | 0.653 | 0.338 |
|  | G | 0.201 | 0.661 |
|  | B | 0.132 | 0.091 |

Figure 7:
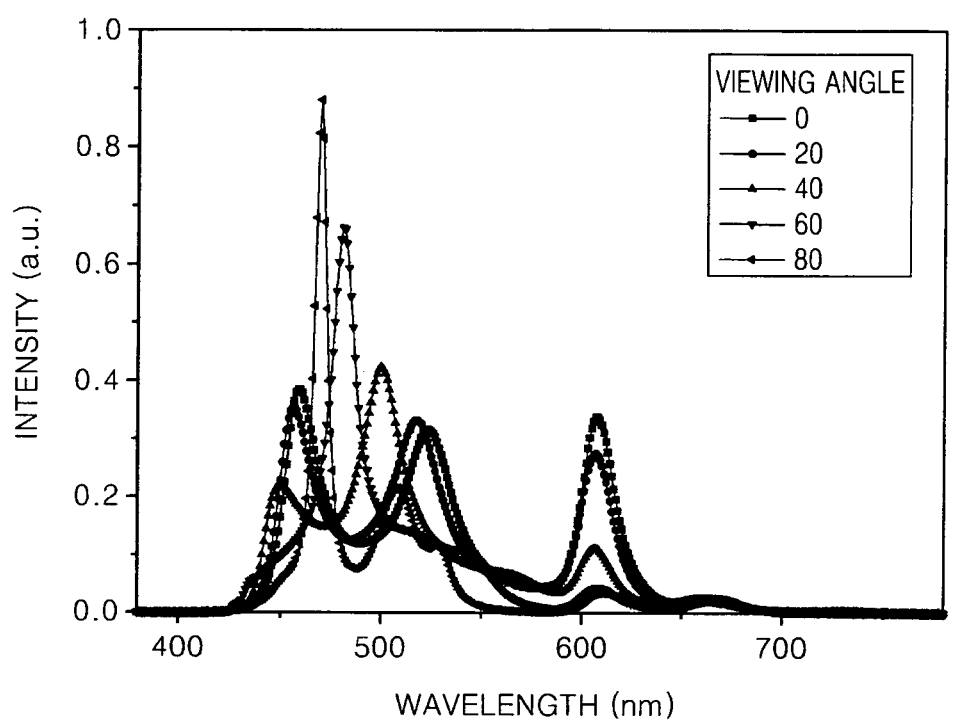
FIG. 7 is a two dimensional graph of simulation results showing an emission spectrum relative to a viewing angle according to the comparative example shown in FIG. 2.

Therefore, from the front view, OLED 20 according to the comparative example has generally excellent performance. Referring to FIG. 7, however, it may be seen that an external emission spectrum varies within a large range according to a viewing angle.

Figure 8A:
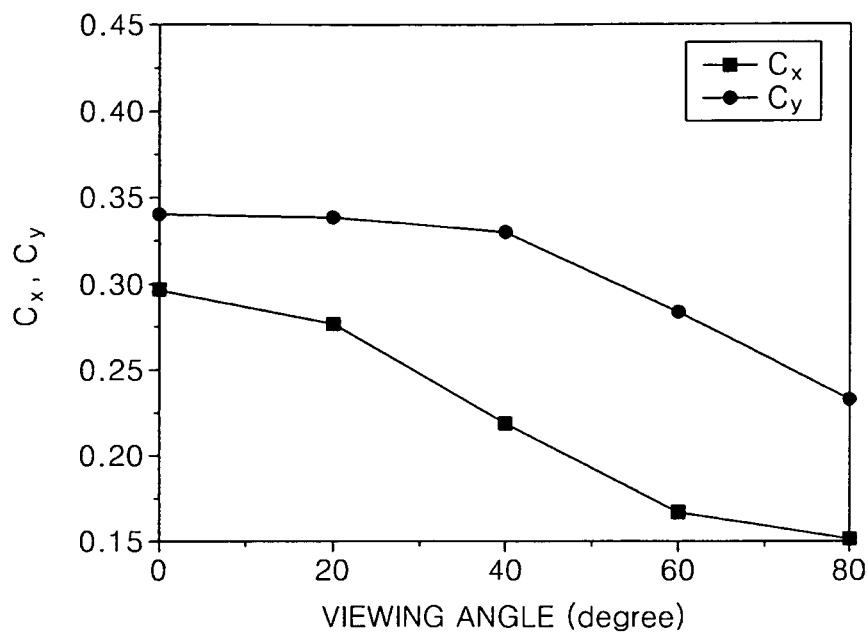
FIG. 8A is a two dimensional graph showing chromaticity coordinates relative to a viewing angle in the white OLED according to the comparative example shown in FIG. 2.
Figure 8B:
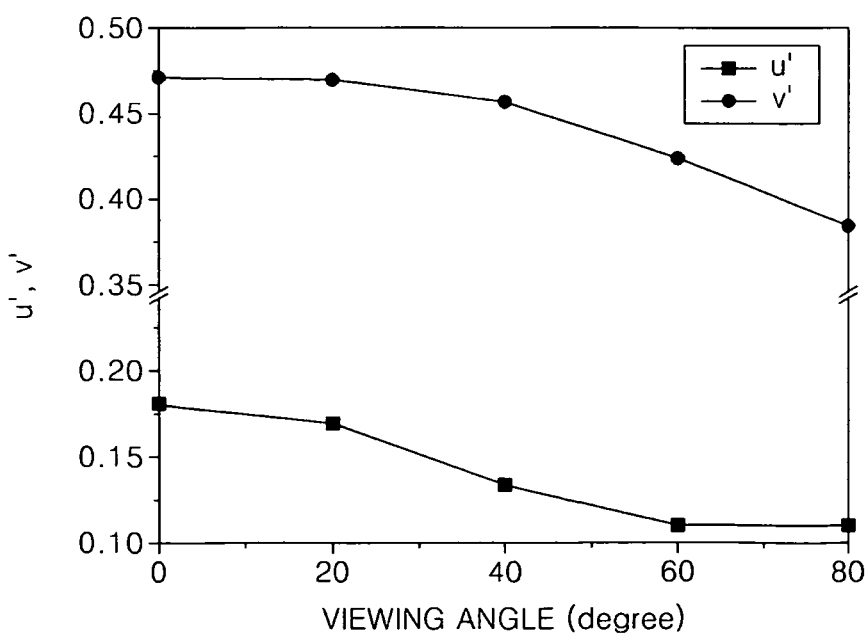
FIG. 8B is a two dimensional graph showing the chromaticity coordinates relative to the viewing angle with respect to values u', v' and in the white OLED according to the comparative example shown in FIG. 2.
Figure 8C:
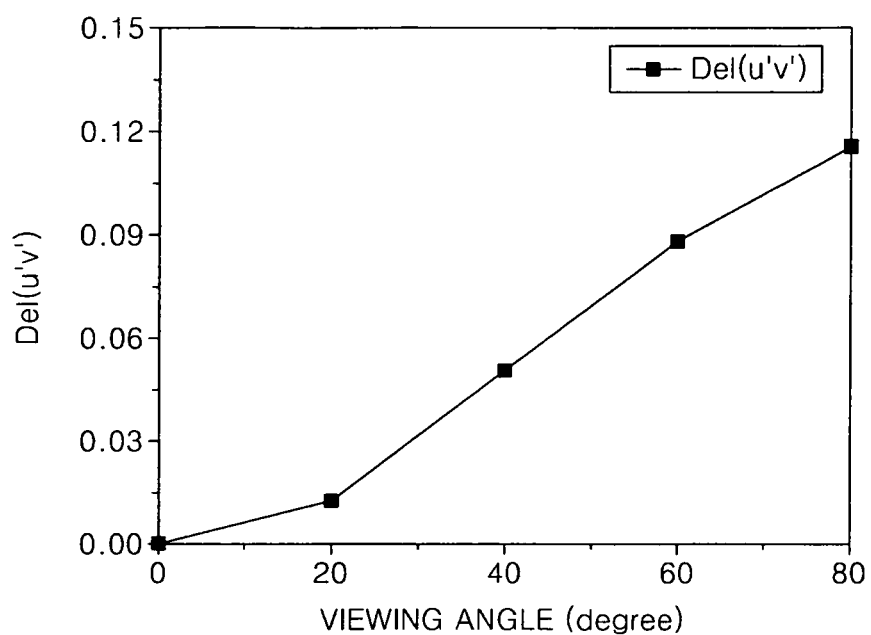
FIG. 8C is a two dimensional graph showing the deviation of a value u'v' relative to a viewing angle from a front view in the white OLED according to the comparative example shown in FIG. 2.

FIG. 8A is a graph showing chromaticity coordinates in CIE 1931 x, y chromaticity diagram relative to a viewing angle in the white OLED according to the comparative example shown in FIG. 2, FIG. 8B is a graph showing the chromaticity coordinates in CIE 1976 u', v' chromaticity diagram relative to the viewing angle with respect to coordinate values u' and v' in the white OLED according to the comparative example shown in FIG. 2, and FIG. 8C is a graph showing a deviation (Del(u'v')) of a value u'v' relative to a viewing angle from the front view in the white OLED according to the comparative example shown in FIG. 2. Referring to FIGS. 8A through 8C, it may be seen that as the viewing angle becomes wider, color varies to a larger extent. The values u', v' are coordinate values of color in CIE 1976 u', v' chromaticity diagram. Typically, "CIE chromaticity diagram" refers to the standard diagram established in 1931. Generally, the CIE 1931 x, y chromaticity diagram characterizes colors by a luminance parameter Y and two color coordinates x and y which specify the point on the chromaticity diagram. Then, two revisions have been made—one in 1960 and one in 1976. Above three scenarios contain the same information while scaled differently. Conceptually, the big advantage attributed to the 1976 diagram is that the distance between points on the diagram is approximately proportional to the perceived color difference.

Second Computer Simulation: Embodiment

Figure 3:
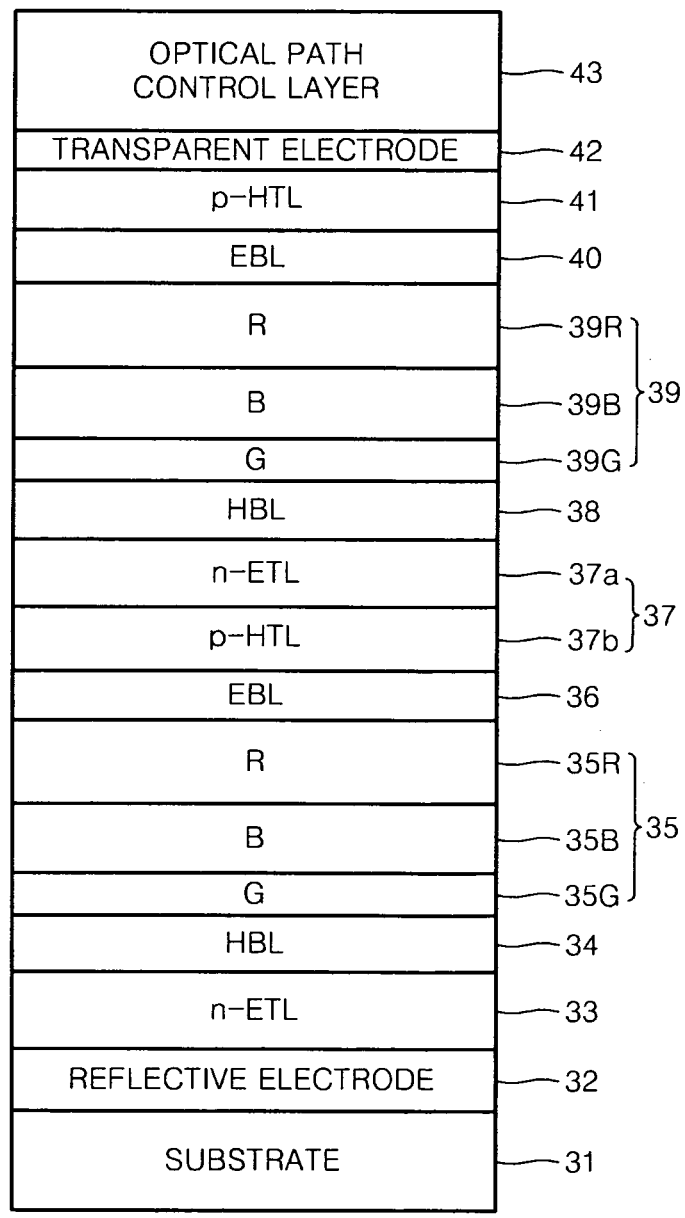
FIG. 3 is a detailed schematic view of a top-emitting white OLED constructed as an embodiment of the present invention.

The second computer simulation was conducted on a white OLED 30 shown in FIG. 3, according to the embodiment of the present invention. Referring to FIG. 3, the white OLED 30 may include a substrate 31 and a reflective electrode 32, an n-doped first ETL 33, a first HBL 34, a first EML 35, a first EBL 36, a PN junction layer 37, a second HBL 38, a second EML 39, a second EBL 40, a p-doped first HTL 41, a transmissive electrode 42, and an optical path control layer 43, which are stacked sequentially on substrate 21. Reflective electrode 32 functions as a cathode, and transmissive electrode 42 functions as an anode. First EML 35 is a white EML including an R EML 35R, a B EML 35B, and a G EML 35G, and second EML 39 is also a white EML including an R EML 39R, a B EML 39B, and a G EML 39G. Meanwhile, PN junction layer 37 emits electrons and holes to first and second EMLs 35 and 39. PN junction layer 37 may include an n-doped second ETL 37a and a p-doped second HTL 37b. First EBL 36, PN junction layer 37, and second HBL 38 may correspond to organic layer 15 shown in FIG. 1 and function to control a distance between first and second EMLs 35 and 39.

FIG. 3 illustrates reflective electrode 32 functioning as a cathode and transmissive electrode 42 functioning as an anode. Reflective electrode 32 however may be embodied as an anode and transmissive electrode 42 may be embodied as a cathode. In this case, first ETL 33 through first HTL 41 should be stacked in the reverse order. Also, reflective electrode 32 may include a transparent electrode formed of a transparent conductive oxide and a metal electrode functioning as a reflective layer in the same manner as described with reference to FIG. 2.

The second computer simulation was conducted on OLED 30 shown in FIG. 3 in which an optical thickness between reflective electrode 32 and transmissive electrode 42 was controlled to be 450 nm, the wavelength of a resonator mode (or a resonance wavelength) was controlled to be 555 nm in consideration of a phase change, and the thickness of optical path control layer 43 was controlled to be 490 nm. In this case, it is assumed that optical path control layer 43 has a refractive index of 2 and an absorption coefficient of 0. Also, it is assumed that white light having the same intensity of 1 is emitted by R EMLs 35R and 39R, B EMLs 35B and 39B, and G EMLs 35G and 39G of first and second EMLs 35 and 39 shown in FIG. 3.

By multiplying a transmissive spectrum of OLED 30 by the internal emission spectra of the R, B, and B light beams shown in FIG. 4 in a ratio of 2.3:0.6:2, an external emission spectrum of OLED 30 shown in FIG. 3 may be obtained. As a result, a white spectrum having chromaticity coordinates (0.280, 0.300) may be obtained from the front view.

The multiplication of the resultant external emission spectrum of OLED 30 by the transmissive spectra of the color filters of FIG. 5 results in the chromaticity coordinates of R, G, and B emitted by R, G, and B color filters, which transmit white light, and the chromaticity coordinates of white light obtained by mixing R, G, and B light as shown in Table 3. Table 3 shows the result coordinate values of colors in CIE 1931 x, y chromaticity diagram. As may be seen from Table 3, after white light is transmitted through the color filters, the white spectrum having chromaticity coordinates (0.284, 0.315) can be obtained from the front view. FIG. 6 is a graph of a comparison of the chromaticity coordinates of the first and second computer simulations with the NTSC chromaticity coordinates. In FIG. 6, '-●-' denotes the NTSC chromaticity coordinates, '-▼-' denotes the chromaticity coordinates according to the first computer simulation, and '-▲-' denotes the chromaticity coordinates according to the second computer simulation. According to the second computer simulation, a color reproduction range of about 94% can be obtained from the front view.

TABLE 3

|  |  | x | y |
|---|---|---|---|
| Original |  W | 0.280 | 0.300 |
| Color filters | W | 0.284 | 0.315 |
|  | R | 0.663 | 0.325 |
|  | G | 0.198 | 0.665 |
|  | B | 0.135 | 0.074 |

Figure 9:
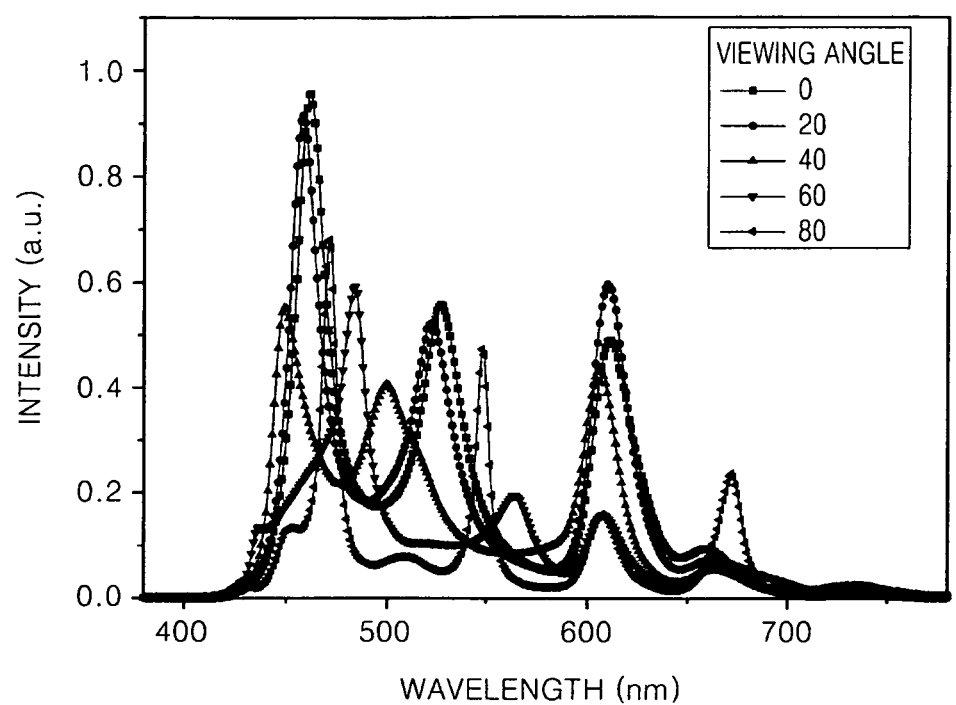
FIG. 9 is a two dimensional graph of simulation results showing an emission spectrum relative to a viewing angle in the top-emitting white OLED shown in FIG. 3.

Therefore, the present invention improves the color reproduction range by approximately 5% more than the comparative example shown in FIG. 2. Referring to FIG. 9 that shows an emission spectrum relative to a viewing angle in white OLED 30 shown in FIG. 3, it may be seen that the external emission spectrum varies with a viewing angle less than in the comparative example shown in FIG. 7.

Figure 10A:
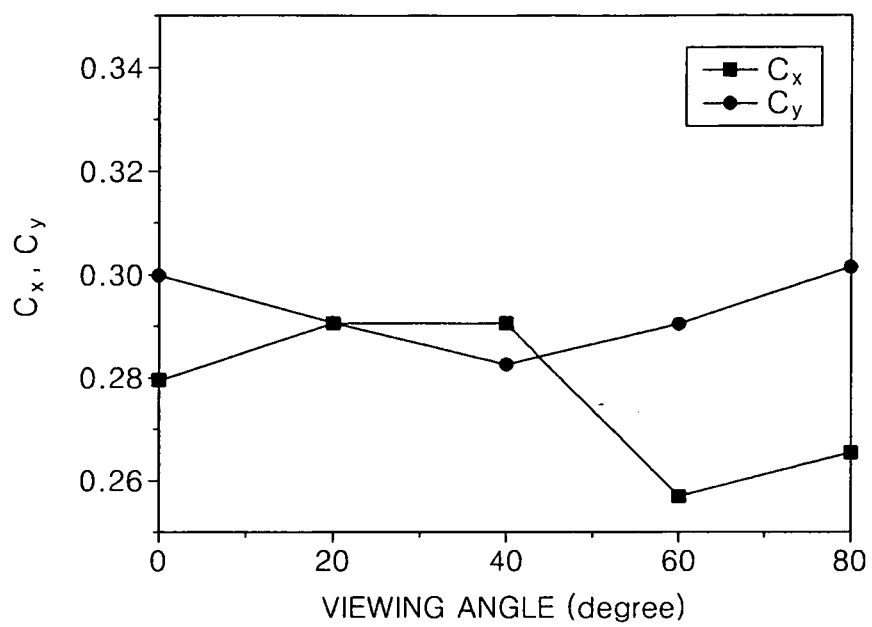
FIG. 10A is a two dimensional graph showing chromaticity coordinates relative to a viewing angle in the top-emitting white OLED shown in FIG. 3.
Figure 10B:
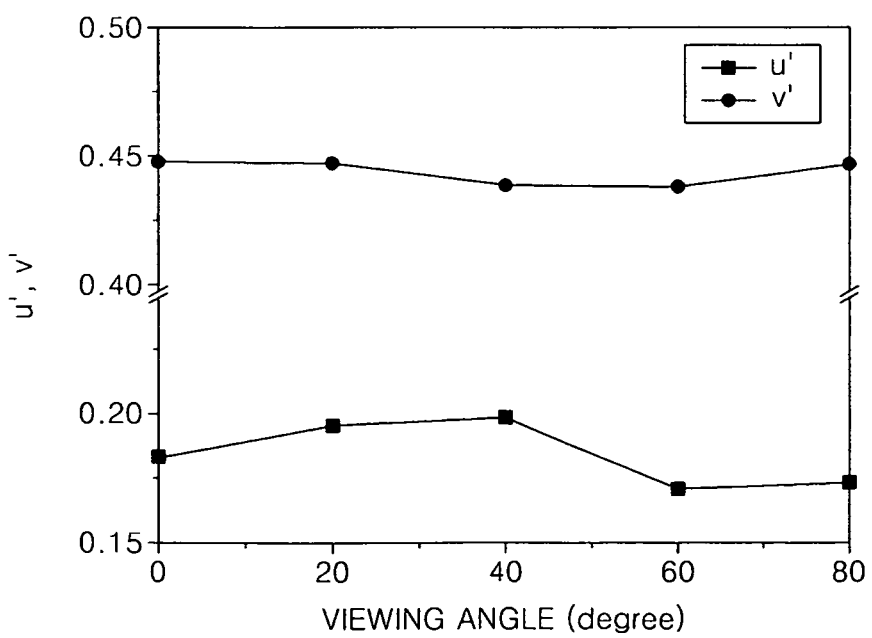
FIG. 10B is a two dimensional graph showing the chromaticity coordinates relative to the viewing angle with respect to values u' and v' in the top-emitting white OLED shown in FIG. 3.
Figure 10C:
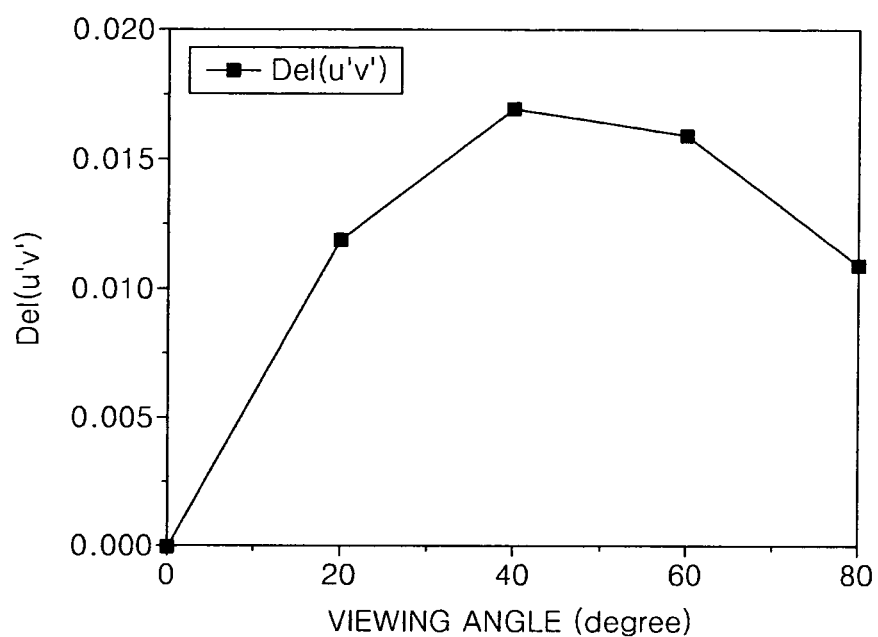
FIG. 10C is a two dimensional graph showing the deviation of a value u'v' relative to a viewing angle from the front view in the top-emitting white OLED shown in FIG. 3.

FIG. 10A is a graph showing chromaticity coordinate in CIE 1931 x, y chromaticity diagram relative to a viewing angle in OLED 30 shown in FIG. 3, FIG. 10B is a graph showing the chromaticity coordinate in CIE 1976 u', v' chromaticity diagram relative to the viewing angle with respect to coordinate values u' and v' in OLED 30 shown in FIG. 3, and FIG. 10C is a graph showing a deviation (Del(u'v')) of a value u'v' relative to a viewing angle from the front view in OLED 30 shown in FIG. 3. Referring to FIGS. 10A through 10C, it can be seen that even if the viewing angle increases, a color variation occurs within only a small range. On comparing FIG. 10C with FIG. 8C, it can be confirmed that a peak (about 0.017) in the deviation (Del(u'v')) of the value u'v' relative to the viewing angle in OLED 30 shown in FIG. 3 is about 10 times as low as a peak (about 0.116) in the deviation (Del (u'v')) of the value u'v' relative to a viewing angle in OLED 20 according to the comparative example.

Figure 11A:
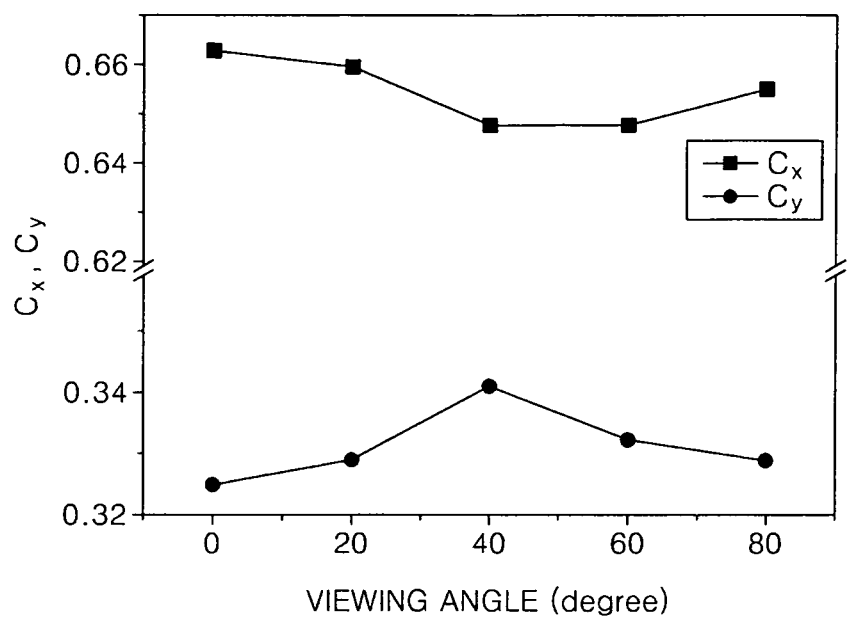
FIG. 11A is a two dimensional graph showing chromaticity coordinates relative to a viewing angle when white light is transmitted through an R color filter of FIG. 5 in the top-emitting white OLED shown in FIG. 3.
Figure 11B:
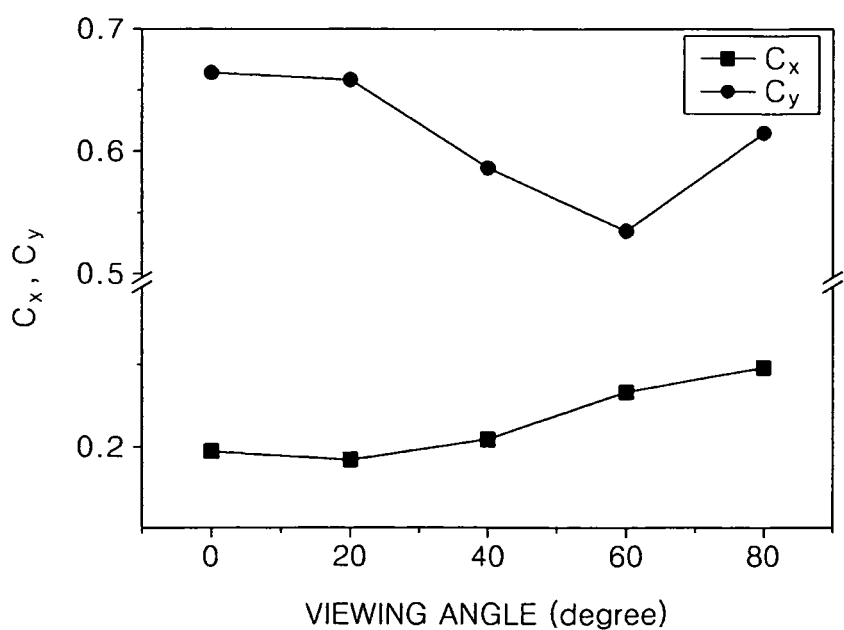
FIG. 11B is a two dimensional graph showing chromaticity coordinates relative to a viewing angle when white light is transmitted through a G color filter of FIG. 5 in the top-emitting white OLED shown in FIG. 3.
Figure 11C:
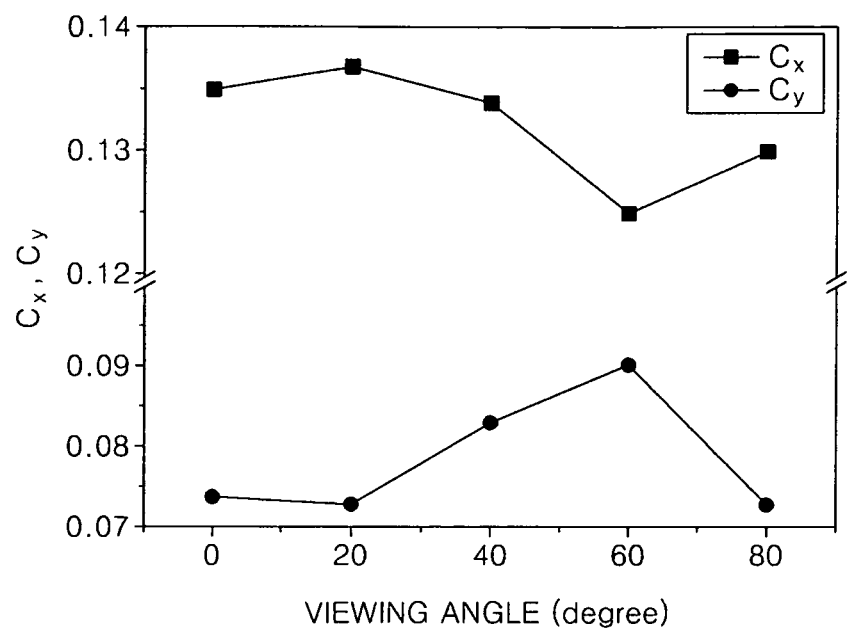
FIG. 11C is a two dimensional graph showing chromaticity coordinates relative to a viewing angle when white light is transmitted through a B color filter of FIG. 5 in the top-emitting white OLED shown in FIG. 3.
Figure 11D:
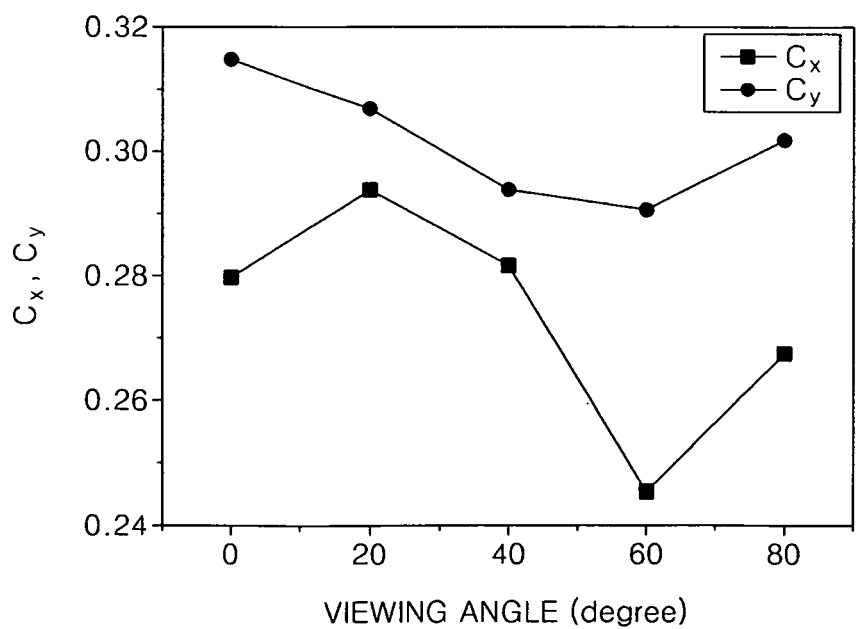
FIG. 11D is a two dimensional graph showing chromaticity coordinates relative to a viewing angle for white light when the white light is transmitted through all color filters of FIG. 5 in the top-emitting white OLED shown in FIG. 3.
Figure 12A:
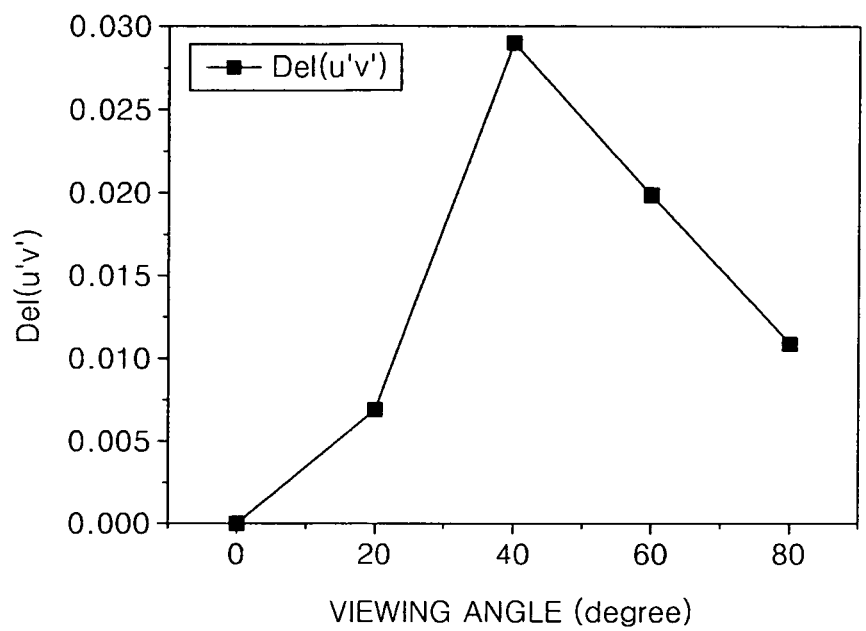
FIG. 12A is a two dimensional graph showing the deviation of a value u'v' relative to a viewing angle when white light is transmitted through the R color filter of FIG. 5 in the top-emitting white OLED shown in FIG. 3.
Figure 12B:
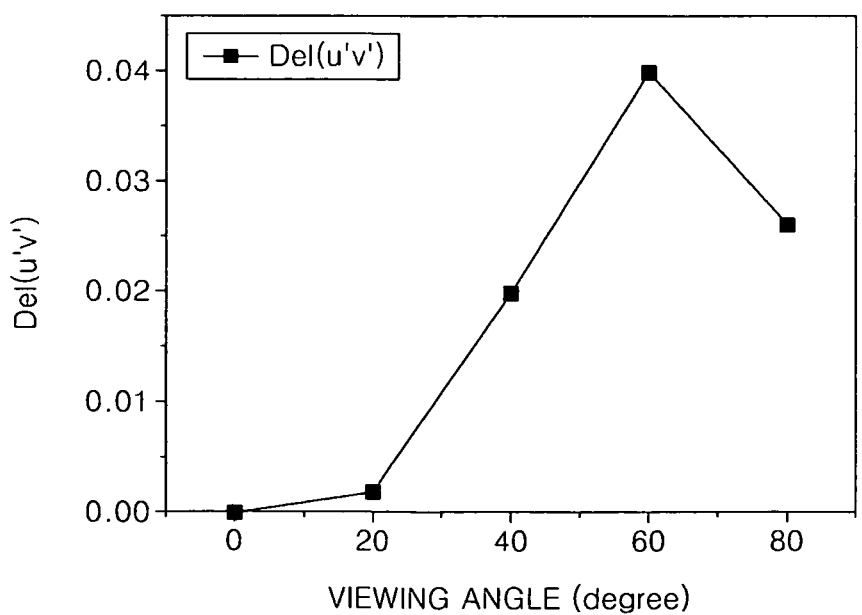
FIG. 12B is a two dimensional graph showing the deviation of a value u'v' relative to a viewing angle when white light is transmitted through the G color filter of FIG. 5 in the top-emitting white OLED shown in FIG. 3.
Figure 12C:
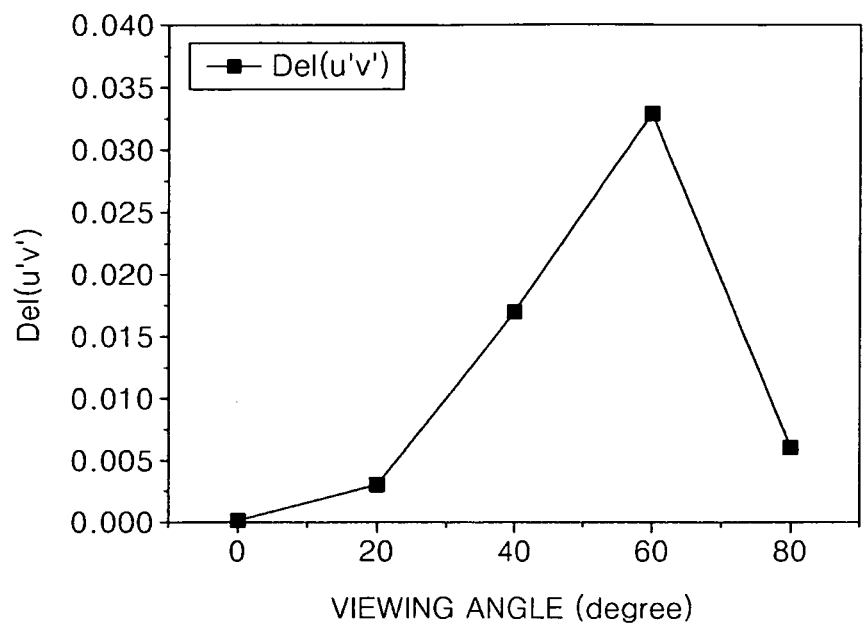
FIG. 12C is a two dimensional graph showing the deviation of a value u'v' relative to a viewing angle when white light is transmitted through the B color filter of FIG. 5 in the top-emitting white OLED shown in FIG. 3.
Figure 12D:
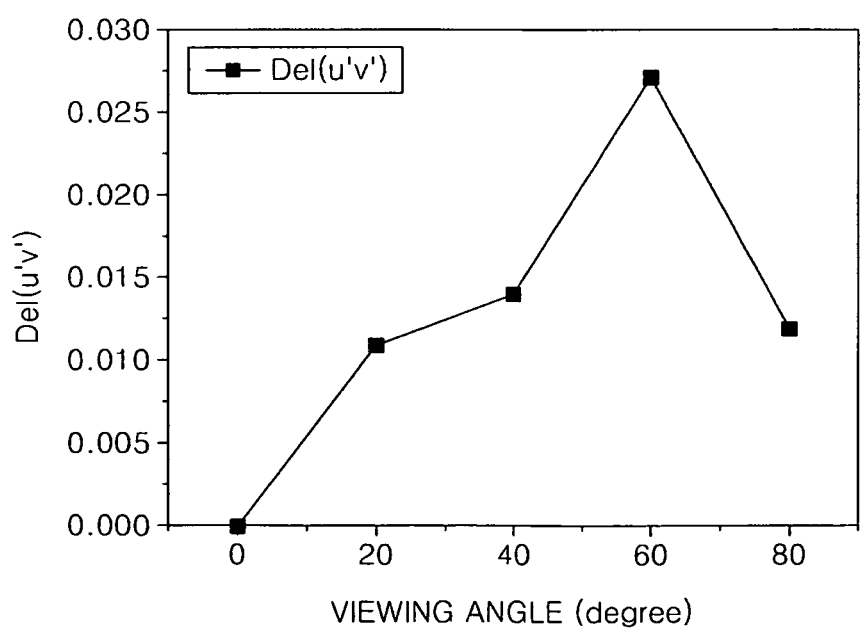
FIG. 12D is a two dimensional graph showing the deviation of a value u'v' relative to a viewing angle for white light when the white light is transmitted through all the color filters of FIG. 5 in the top-emitting white OLED shown in FIG. 3.

FIG. 11A is a graph showing chromaticity coordinate in CIE 1931 x, y chromaticity diagram relative to a viewing angle when white light is transmitted through an R color filter of FIG. 5 in OLED 30 shown in FIG. 3, FIG. 11B is a graph showing chromaticity coordinate in CIE 1931 x, y chromaticity diagram relative to a viewing angle when white light is transmitted through a G color filter of FIG. 5 in OLED 30 shown in FIG. 3, FIG. 11C is a graph showing chromaticity coordinate in CIE 1931 x, y chromaticity diagram relative to a viewing angle when white light is transmitted through a B color filter of FIG. 5 in OLED 30 shown in FIG. 3 and FIG. 11D is a two dimensional graph showing chromaticity coordinate in CIE 1931 x, y chromaticity diagram relative to a viewing angle for white light when the white light is transmitted through all color filters of FIG. 5 in the top-emitting white OLED shown in FIG. 3. FIG. 12A is a graph showing the deviation of a value u' v' in CIE 1976 u', v' chromaticity diagram relative to a viewing angle when white light is transmitted through the R color filter of FIG. 5 in the top-emitting white OLED shown in FIG. 3, FIG. 12B is a graph showing the deviation of a value u'v' in CIE 1976 u', v' chromaticity diagram relative to a viewing angle when white light is transmitted through the G color filter of FIG. 5 in OLED 30 shown in FIG. 3, FIG. 12C is a graph showing the deviation of a value u'v' in CIE 1976 u', v' chromaticity diagram relative to a viewing angle when white light is transmitted through the B color filter of FIG. 5 in OLED 30 shown in FIG. 3, and FIG. 12D is a graph showing the deviation of a value u'v' in CIE 1976 u', v' chromaticity diagram relative to a viewing angle for white light when the white light is transmitted through all the color filters of FIG. 5 in the OLED 30 shown in FIG. 3. Referring to FIGS. 11A through 11D, it can be confirmed that after light is transmitted through the color filters, a color variation occurs within only a very small range. Also, referring to FIGS. 12A through 12D, it may be observed that after light is transmitted through the color filters, peaks in the deviation (Del(u'v')) for R, G, B, and white light are maintained very low. Specifically, the peaks in the deviation (Del (u'v')) for R, G, B, and white light are about 0.029, 0.04, 0.033, and 0.027, respectively.

When the above-described OLED according to the present invention is applied to a color display apparatus, the color display apparatus may greatly improve a color reproduction range and reduce a variation of color with a viewing angle.

FIG. 13 is a cross-sectional view of a color display apparatus 100 using the white OLED of FIG. 1, according to an embodiment of the present invention.

Referring to FIG. 13, respective electrodes 12 corresponding respectively to sub-pixels are disposed on a single common substrate 11. A hole transport layer (HTL) 13, a first emission layer (EML) 14, an organic layer 15, a second EML 16, an electron injection layer (EIL) 17, a transmissive electrode 18, and an optical path control layer 19 may be formed sequentially on common substrate 11 having reflective electrodes 12. A transparent front substrate 50 is disposed opposite optical path control layer 19, and R, G, and B color filters 51R, 51G, and 51B corresponding respectively to the sub-pixels are disposed on a bottom surface of front substrate 50. Although not shown in FIG. 13, black matrix (BM) for completely absorbing external light may be further disposed between each pair of color filters in order to elevate visibility. Also, a low-refractive index layer (not shown), such as a gas layer or a low-refractive filler, may be further prepared between front substrate 50 and optical path control layer 19. Furthermore, a dielectric mirror or a thin metal mirror may be further provided on a top surface of optical path control layer 19.

According to the present invention, as shown in FIG. 13, an OLED including electrodes and EMLs may be constructed such that all sub-pixels have the same structure irrespective of colors of the sub-pixels. Also, it is unnecessary to control an optical distance in a sub-pixel according to color, so that all reflective electrodes 12 disposed below the sub-pixels can have the same structure. In addition, since the OLED can emit almost pure white light, pure color can be created using color filters 51R, 51G, and 51B. Furthermore, a variation in color can be greatly reduced according to a viewing angle.

As explained thus far, the present embodiment provides a technique for improving the characteristics of the white OLED. However, the present invention is not limited to the white OLED and can be also applied to single-color OLEDs that are manufactured using an independent deposition process and permit respective pixels to emit light in different colors. For example, although FIGS. 1 and 3 illustrate at least two white EMLs, each white EML including R, B, and G EMLs, the present invention can be applied to a single-color OLED that includes only at least two single-color EMLs (i.e., at least two R EMLs, at least two B EMLs, or at least two G EMLs) instead of the white EMLs. In this case, a distance between at least two single-color EMLs that emit light in the same color satisfies the condition of constructive interference shown in Table 1. Also, single-color OLEDs that are deposited on R, G, and B sub-pixels to emit light in different colors are manufactured to the same thickness, and an optical path control layer prepared on a transmissive electrode is formed to a sufficiently great thickness, thereby causing multi-resonance. As a result, the single-color OLED that improves a color reproduction range and reduces a variation of color with a viewing angle can be embodied. A color display apparatus using the single-color OLEDs as R, G, and B sub-pixels may not employ the color filters 51R, 51G, and 51B shown in FIG. 13.

Although the top-emitting OLED was described above, the same principles can be also applied to a bottom-emitting OLED. Therefore, the present invention is not limited to the top-emitting OLED and can be applied likewise to the bottom-emitting OLED.

While the present invention has been particularly shown and described with reference to exemplary embodiments thereof, it will be understood by one of ordinary skill in the art that various changes in form and details may be made therein without departing from the spirit and scope of the present invention as defined by the following claims.

What is claimed is:

1. An organic light emitting display (OLED) device, comprising:
    a reflective electrode and a transmissive or semi-transmissive electrode disposed opposite each other;
    at least two organic emission layers (EMLs) interposed between the reflective electrode and the transmissive or semi-transmissive electrode, each EML comprising a same group of sub EMLs and each sub EML emitting light of a predetermined color;
    an organic layer disposed between the EMLs, and the organic layer controlling a distance between the EMLs to satisfy a condition of constructive interference for light emitted from a major surface of a respective sub EML emitting light of a same color in each EML; and
    an optical path control layer disposed on the transmissive or semi-transmissive electrode and the optical path control layer being spaced apart from the EMLs by the transmissive or semi-transmissive electrode,
    the OLED device having a resonator formed between the reflective electrode and the optical path control layer and a resonance mode of light extracted from the optical path control layer being a multi-resonance mode having at least two modes in a visible light region,
    wherein the at least two organic EMLs are white EMLs, each white EML including a first sub EML emitting light of red, a second sub EML emitting light of green, and a third sub EML emitting light of blue, and
    wherein each of distances between the EMLs emitting light in a same color in the at least two organic EMLs satisfies the condition of the constructive interference.

2. An organic light emitting display (OLED) device, comprising:
    a reflective electrode and a transmissive or semi-transmissive electrode disposed opposite each other;
    at least two organic emission layers (EMLs) interposed between the reflective electrode and the transmissive or semi-transmissive electrode, each EML comprising a same group of sub EMLs and each sub EML emitting light of a predetermined color;
    an organic layer disposed between the EMLs, and the organic layer controlling a distance between the EMLs to satisfy a condition of constructive interference for light emitted from a major surface of a respective sub EML emitting light of a same color in each EML; and
    an optical path control layer disposed on the transmissive or semi-transmissive electrode and the optical path control layer being spaced apart from the EMLs by the transmissive or semi-transmissive electrode,
    the OLED device having a resonator formed between the reflective electrode and the optical path control layer and a resonance mode of light extracted from the optical path control layer being a multi-resonance mode having at least two modes in a visible light region,
    wherein the at least two organic EMLs are white EMLs, each white EML including two kinds of single-color or multi-color sub EMLs that emit light in complementary colors, and
    wherein each of distances between the EMLs emitting light in a same color in the at least two organic EMLs satisfies the condition of the constructive interference.

3. The OLED device of claim 1, in which a distance between the sub EMLs emitting light in the same color in the at least two organic EMLs is greater than a distance that permits center wavelength of a blue color in order to satisfy the condition of the constructive interference.

4. The OLED device of claim 1, in which the distance between the sub EMLs emitting light in the same color of at least two organic EMLs has a toleration within ±10% of a distance that permits center wavelength of a blue color to satisfy the condition of the constructive interference.

5. The OLED device of claim 1, further comprising a PN junction layer interposed between the at least two organic EMLs.

6. The OLED device of claim 5, in which the PN junction layer includes an n-doped electron transport layer (ETL) and a p-doped hole transport layer (HTL).

7. The OLED device of claim 1, in which the optical path control layer is formed of a material having an optical transmittance of 90% or higher in a visible light region.

8. The OLED device of claim 7, in which the optical path control layer has a refractive index in range of approximately from 1.6 to 2.6.

9. The OLED device of claim 7, in which the optical path control layer is formed of at least one selected from a group consisting of $Al_2O_3$, BaO, MgO, $HfO_2$, $ZrO_2$, $CaO_2$, $SrO_2$, $Y_2O_3$, $Si_3N_4$, AlN, GaN, ZnS, and CdS.

10. The OLED device of claim 7, in which the optical path control layer has a thickness in range of approximately from 300 nm to 900 nm.

11. The OLED device of claim 1, in which the reflectance of the transmissive or semi-transmissive electrode ranges approximately from 0.1% to 50%.

12. The OLED device of claim 11, in which the transmissive or semi-transmissive electrode is formed using one selected from a thin metal layer and a transparent conductive oxide.

13. The OLED device of claim 1, further comprising a multiple dielectric mirror layer disposed on a top surface of the optical path control layer, the multiple dielectric mirror layer formed by alternating a high-refractive index dielectric layer and a low-refractive index dielectric layer.

14. The OLED device of claim 1, further comprising a thin metal mirror layer disposed on the top surface of the optical path control layer.

15. A color display apparatus, comprising:
a reflective electrode and a transmissive or semi-transmissive electrode disposed opposite each other;
at least two organic emission layers (EMLs) interposed between the reflective electrode and the transmissive or semi-transmissive electrode, each EML comprising a same group of sub EMLs and each sub EML emitting light of a predetermined color;
an organic layer disposed between the EMLs, and the organic layer controlling a distance between the EMLs to satisfy a condition of constructive interference for light emitted from a major surface of a respective sub EML emitting light of a same color in each EML;
an optical path control layer disposed on the transmissive or semi-transmissive electrode and the optical path control layer being spaced apart from the EMLs by the transmissive or semi-transmissive electrode;
a transparent substrate disposed opposite the optical path control layer; and
a plurality of color filters disposed on a surface of the transparent substrate,
the color display apparatus having resonators respectively formed between the reflective electrodes and the optical path control layer so that a resonance mode of light extracted from the optical path control layer is a multi-resonance mode having at least two modes in a visible light region,
wherein the at least two organic EMLs are white EMLs, each white EML including a first sub EML emitting light of red, a second sub EML emitting light of green, and a third sub EML emitting light of blue, and
wherein each of distances between the EMLs emitting light in a same color in the at least two organic EMLs satisfies the condition of the constructive interference.

16. The apparatus of claim 15, in which a distance between the sub EMLs emitting light in the same color in the least two organic EMLs is greater than a distance that permits center wavelength of a blue color in order to satisfy the condition of the constructive interference.

17. The apparatus of claim 15, in which the distance between the sub EMLs emitting light in the same color in the at least two organic EMLs having a toleration of approximately ±10% of the distance that permits center wavelength of a blue color to satisfy the condition of the constructive interference.

18. The apparatus of claim 15, further comprising a PN junction layer interposed between the at least two organic EMLs.

19. The apparatus of claim 15, in which the optical path control layer is formed of a material having an optical transmittance of 90% or higher in a visible light region.

20. The apparatus of claim 15, in which the plurality of color filters are opposite to the optical path control layer.

21. An organic light emitting display (OLED) device, comprising:
a substrate;
a reflective electrode and a transmissive or semi-transmissive electrode formed on a same side of the substrate and disposed opposite each other;
at least two white organic emission layers (EMLs) interposed between the reflective electrode and the transmissive or semi-transmissive electrode, each white EML comprising a same group of sub EMLs and each sub EML emitting light of a predetermined color;
an organic layer disposed between the white EMLs, and the organic layer controlling a distance between the white EMLs to satisfy a condition of constructive interference for light emitted from a major surface of a respective sub EML emitting light of a same color in each white EML;
an optical path control layer disposed on the transmissive or semi-transmissive electrode, and the optical path control layer being spaced apart from the white EMLs by the transmissive or semi-transmissive electrode; and
the OLED device having a resonator formed between the reflective electrode and the optical path control layer and thus a resonance mode of light extracted from the optical path control layer being a multi-resonance mode having at least two modes in a visible light region,
wherein, each white EML including a first sub EML emitting light of red, a second sub EML emitting light of green, and a third sub EML emitting light of blue, and
wherein each of distances between the EMLs emitting light in a same color in the at least two organic EMLs satisfies the condition of the constructive interference.

* * * * *